(12) United States Patent
Nishida (10) Patent No.: US 10,581,449 B2
(45) Date of Patent: Mar. 3, 2020

(54) INVERTER-BASED RESISTORS, ANALOG-TO-DIGITAL CONVERTERS, AND METHODS FOR DYNAMICALLY GENERATING RESISTANCE IN A DIGITAL-ONLY CIRCUIT

(71) Applicant: Agency for Science, Technology and Research, Singapore (SG)

(72) Inventor: Yoshio Nishida, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 0 days.

(21) Appl. No.: 16/096,679

(22) PCT Filed: Apr. 25, 2017

(86) PCT No.: PCT/SG2017/050228
§ 371 (c)(1),
(2) Date: Oct. 25, 2018

(87) PCT Pub. No.: WO2017/188897
PCT Pub. Date: Nov. 2, 2017

(65) Prior Publication Data
US 2019/0181877 A1    Jun. 13, 2019

(30) Foreign Application Priority Data

Apr. 25, 2016 (SG) .......................... 10201603270Q (51) Int. Cl.
*H03M 1/12* (2006.01)
*H03M 1/60* (2006.01)
*G01F 1/56* (2006.01)

(52) U.S. Cl.
CPC ................ *H03M 1/60* (2013.01); *G01F 1/56* (2013.01)

(58) Field of Classification Search
CPC ....................................................... H03M 1/60
(Continued)

(56) References Cited

U.S. PATENT DOCUMENTS 8,400,341 B2 *  3/2013  Su ....................... H03M 1/1265
                                                                341/157
8,847,808 B1    9/2014  Chi et al.
(Continued)

FOREIGN PATENT DOCUMENTS

CN      102801425 A    11/2012
WO  WO 2014/085410 A1    6/2014

OTHER PUBLICATIONS

PCT International Search Report for PCT Counterpart Application No. PCT/SG2017/050228, 5 pgs. (dated Jun. 20, 2017).
(Continued)

*Primary Examiner* — Peguy Jean Pierre
(74) *Attorney, Agent, or Firm* — Womble Bond Dickinson (US) LLP (57) ABSTRACT

According to various embodiments, an inverter-based resistor may be provided. The inverter-based resistor may include at least one digital inverter, wherein each of the at least one digital inverter is configured to receive an input and provide an output, each of the at least one digital inverter further includes a positive voltage rail and a negative voltage rail, wherein the digital inverter input is connected to the inverter output and the positive voltage rail is connected to the negative voltage rail, and wherein a current flowing through the inverter-based resistor varies in direction and magnitude in response to a digital input provided to the positive voltage rail and the negative voltage rail.

15 Claims, 12 Drawing Sheets

(58) Field of Classification Search
USPC .......................................................... 341/155
See application file for complete search history.

(56) References Cited

U.S. PATENT DOCUMENTS

| | | | |
|---|---|---|---|
| 9,490,782 B2* | 11/2016 | Sharma | H03K 3/0372 |
| 2013/0187804 A1 | 7/2013 | Kaald | |
| 2016/0226447 A1* | 8/2016 | Fukuzawa | H03B 5/32 |

OTHER PUBLICATIONS

PCT Written Opinion of the International Searching Authority for PCT Counterpart Application No. PCT/SG2017/050228, pp. 6 pgs. (dated Jun. 20, 2017).

Jacomet et al., "On the Dynamic Behavior of a Novel Digital-Only Sigma-Delta A/D Converter," IEEE ISCAS, SBCCI'04, Sep. 7-11, 2004, 6 pages.

* cited by examiner

INVERTER-BASED RESISTORS, ANALOG-TO-DIGITAL CONVERTERS, AND METHODS FOR DYNAMICALLY GENERATING RESISTANCE IN A DIGITAL-ONLY CIRCUIT

CROSS-REFERENCE TO RELATED APPLICATIONS

This patent application is a U.S. National Phase Application under 35 U.S.C. § 371 of International Application No. PCT/SG2017/050228, filed on 25 Apr. 2017, entitled INVERTER-BASED RESISTORS, ANALOG-TO-DIGITAL CONVERTERS, AND METHODS FOR DYNAMICALLY GENERATING RESISTANCE IN A DIGITAL-ONLY CIRCUIT, which claims priority to Singapore patent application No. 102016032700, filed on 25 Apr. 2016.

TECHNICAL FIELD

The following discloses inverter-based resistors, analog-to-digital converters, and methods for dynamically generating resistance in a digital-only circuit.

BACKGROUND ART

Analog-to-Digital Converters (ADCs) are requisite electrical devices in this modern world since they interface our "analog" environment with the high technology "digital" world.

Thus, an ADC architecture is needed which is effective and cost efficient.

Furthermore, other desirable features and characteristics will become apparent from the subsequent detailed description and the appended claims, taken in conjunction with the accompanying drawings and this background of the disclosure.

SUMMARY OF INVENTION

In accordance with a first aspect, an inverter-based resistor may be provided. The inverter-based resistor may include at least one digital inverter, wherein each of the at least one digital inverter is configured to receive an input and provide an output, each of the at least one digital inverter further includes a positive voltage rail and a negative voltage rail, wherein the digital inverter input is connected to the inverter output and the positive voltage rail is connected to the negative voltage rail, and wherein a current flowing through the inverter-based resistor varies in direction and magnitude in response to a digital input provided to the positive voltage rail and the negative voltage rail.

In accordance with a second aspect, an analog-to-digital converter (ADC) may be provided. The ADC may include: a phase feedback voltage controlled oscillator (VCO) quantizer having a VCO input and a quantizer output; and a feedback loop coupling the VCO input of the phase feedback VCO quantizer to the quantizer output of the phase feedback VCO quantizer, the feedback loop including one or more inverter-based resistance devices, wherein each of the one or more digital resistance devices includes at least one digital inverter.

In accordance with a third aspect, a method for dynamically generating resistance in a digital-only circuit may be provided. The method may include: providing at least one digital inverter, wherein each of the at least one digital inverter is configured to receive an input and provide an output, the digital inverter including a positive voltage rail and a negative voltage rail, wherein the digital inverter input is connected to the digital inverter output and the positive voltage rail is connected to the negative voltage rail of each of the at least one digital inverter; providing a first voltage at both the positive voltage rail terminal and the negative voltage rail terminal; providing a current to flow through each of the at least one digital inverter from the positive voltage rail terminal or the negative voltage rail terminal and/or the digital inverter output; and varying a direction of the current flowing through the each of the at least one digital inverter to dynamically generate resistance of the at least one digital inverter.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments, by way of example only, and to explain various principles and advantages in accordance with a present embodiment.

FIGS. 9A to 9E show simulation results with process variation (FIG. 9A a typical-typical model (R1=10 k$\Omega$); FIG. 9B a fast-fast model (R1=4.9 k$\Omega$); FIG. 9C a slow-slow model (R1=25.2 k$\Omega$; FIG. 9D an snfp model (R1=12.2 k$\Omega$; FIG. 9E an fnsp model (R1=10.3 k$\Omega$).

Skilled artisans will appreciate that elements in the figures are illustrated for simplicity and clarity and have not necessarily been depicted to scale. For example, the dimensions of some of the elements in the block diagrams or steps in the flowcharts may be exaggerated in respect to other elements to help improve understanding of the present embodiment.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description. It is the intent of the preferred embodiments to disclose methods and systems which are able to provide resistors and analog digital converters in an entirely digital process.

A "not-gate" is a digital component which inverts a "digital high" input signal to a "digital low" output signal or inverts a "digital low" input signal to a "digital high" output signal. In accordance with the present embodiments, a "digital inverter" is equivalent to a "not-gate".

Analog-to-Digital Converters (ADCs) are requisite electrical components for various devices. ADCs interface an "analog" environment with a high technology "digital" world. Analog signals (such as voice, vision, temperature, and similar signals) are coded to 0/1 digital signals (in other words: signals including only 0s and 1s as their data) by the ADCs, and the digital data are processed in complex algorithms offered by digital signal processors (DSPs). Improved performances of the DSPs by the benefit from the advanced semiconductor technology node require higher-resolution and higher-speed to the ADCs in the electrical systems. However, while more advanced nodes benefit to the digital circuits in terms of speed, power, and so on, they on the other hand, put analog circuits (including ADCs) in a tougher design environment (for example lower voltage, higher noise, or the like). Because of this fact, much design effort needs to be spent when porting conventional analog-oriented ADCs from original process node to more advanced node. From this point of view, therefore, it is preferable that ADC are built up from a lower number of analog circuits (i.e. operation amplifier (opamp), comparators, and similar components), but from digital cells, resulting in the more smooth IP porting (in other words, resulting in the IP porting with less design efforts). This type of ADC may be referred to as "digital-oriented".

Figure 1:
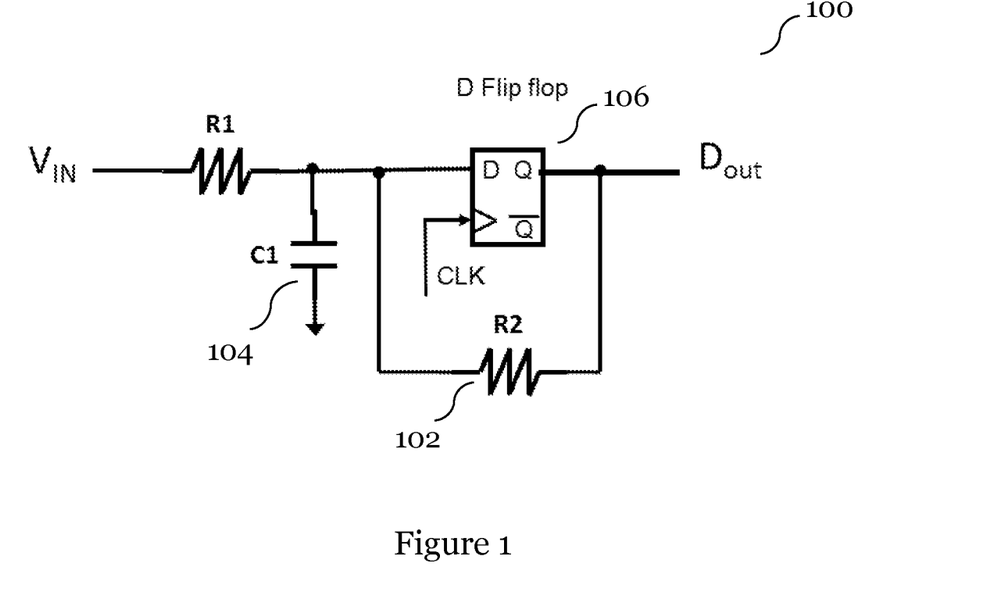
FIG. 1. A digital-only analog to digital converter.

FIG. 1 shows a digital-only ADC 100, which is a highly digital-oriented circuit. The ADC 100 is a ΔΣ (delta sigma) ADC and uses a passive RC-integrator (employing resistor R 102 and capacitor C 104) within the feedback and a D-flip-flop 106 as a voltage comparator. Since only one voltage comparator is provided in the ADC 100, the ADC 100 may be regarded as the single-bit ΔΣ ADC. Apparently the circuit is simple structure and it does not have any active analog circuits. Not having any active analog circuits provides a significant advantage of this ADC that it is able to be implemented in digital cells. Also the passive components (RC, in other words resistor R 102 and capacitor C 104) may be excluded from the chip without significant design effort. However, because this architecture is limited to a single bit and cannot extend to multi-bits, the resolution may be limited (for example about 8 bits). In addition regarding the stability of the loop, the single-bit ΔΣ ADC is less stale compared with multi-bit ADC.

Figure 2:
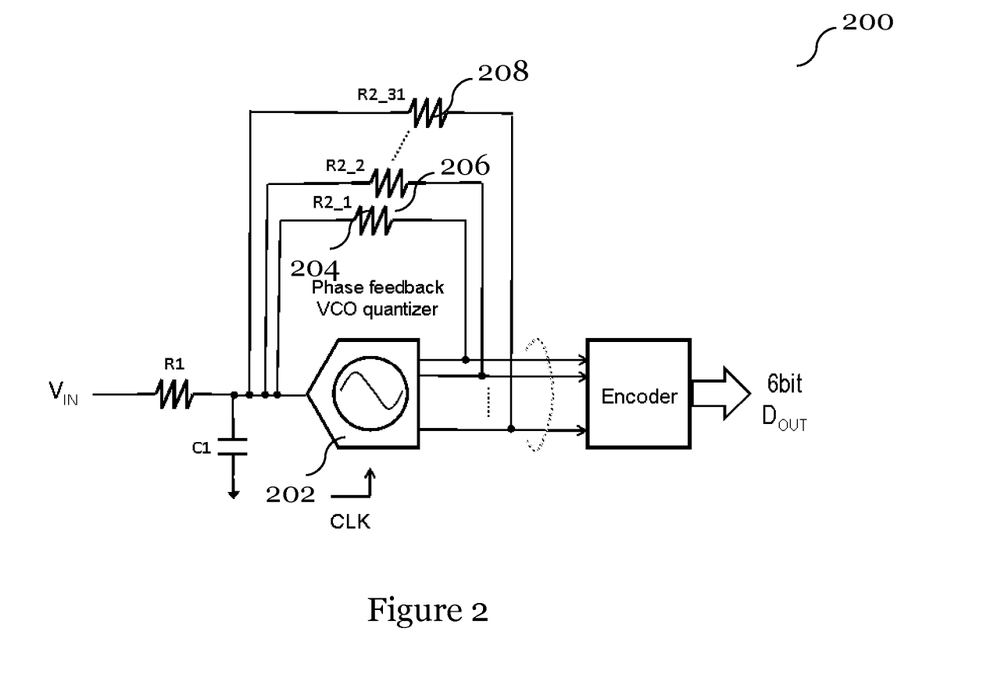
FIG. 2 shows a multi-bit digital-only analog to digital converter.

FIG. 2 shows a multi-bit digital only ADC 200. With the quantizer of FIG. 1 substituted with the VCO based quantizer 202 of FIG. 2, the resolution of the quantizer as well as the stability of the loop may be improved without degrading the digital orientation of the ADC. Among VCO base quantizers, the phase feedback quantizer has an advantageous feature of reduced harmonics on the ADC output; since the phase feedback makes the VCO input voltage range smaller, accordingly resulting in lower harmonics in ADC output. However, one drawback on this ADC is the necessity of parallel resistances 204, 206, 208 in the feedback. Because a pure digital process does not have any resistors/capacitors which usually require additional options, implementing the ADC is more costly. On the other hand, the ADC as shown in FIG. 2 may require many parallel output pins (for example, in case of the ADC illustrated in FIG. 2, the number may be 31 (for example R2_1 to R2_31) to use external components.

A conventional VCO base ADC cannot be implemented in a pure digital process, so that feedback resistors need to be external which is costly.

Various ADCs include analog circuits which require many re-design efforts when the ADC is ported to advance nodes. Many digital-only ADCs require passive devices (for example resistors and/or capacitors) which pure digital process does not fabricate in the microchip.

According to various embodiments, a digital-only analog-to-digital converter (ADC) may be provided. The digital-only ADC may employ inverter-based resistors, so that the ADC may be implemented in cheap digital CMOS (complementary metal—oxide—semiconductor) technology without any resistor options. Employing this ADC IP (intellectual property) advantageously reduces re-design efforts when the ADC is ported to an advanced technology node, and accordingly it also lowers the cost for product development.

According to various embodiments, a digital-only ADC (analog digital converter) employing (in other words: including) an inverter-based resistance may be provided.

According to various embodiments, a dynamic inverter-based resistor may be provided. According to various embodiments, a digital-only ADC may be provided.

Figure 3A:
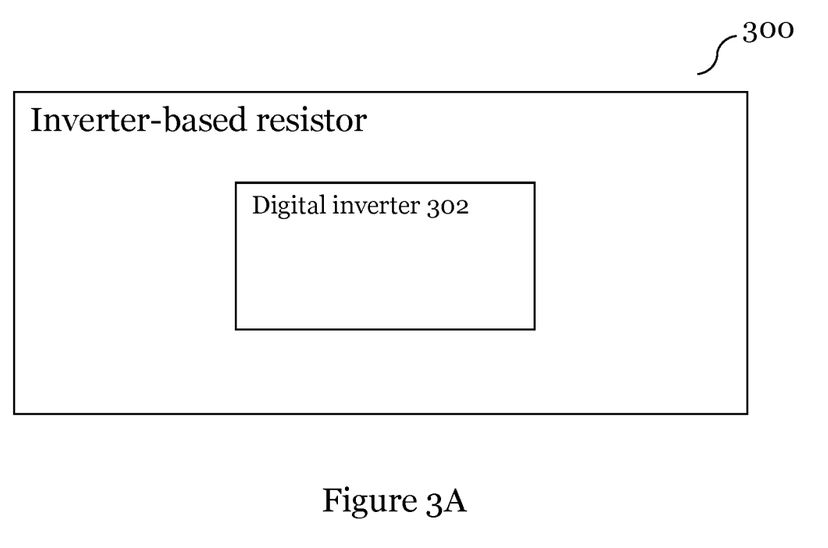
FIG. 3A shows an inverter-based resistor according to various embodiments.
Figure 5A:
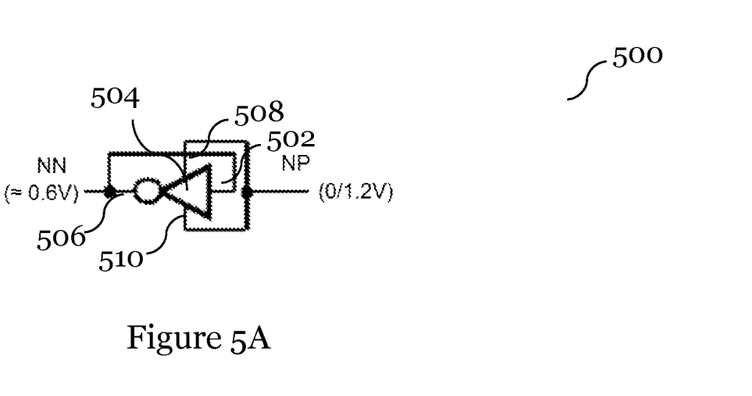
FIGS. 5A, 5B, 5C, and 5D show an inverter-based resistor according to various embodiments.

FIG. 3A shows an inverter-based resistor 300 (for example a resistor 500 as shown in FIG. 5A) according to various embodiments. The inverter-based resistor 300 may include at least one digital inverter 302 (for example inverter 504 as shown in FIG. 5A). Each of the at least one digital inverter 302 may be configured to receive an input (for example input 502 as shown in FIG. 5A) and provide an output (for example output 506 as shown in FIG. 5A). Each of the at least one digital inverter 302 may further include a positive voltage rail (for example Vdd 508 as shown in FIG. 5A) and a negative voltage rail (for example Vss 510 as shown in FIG. 5A), wherein the digital inverter input is connected to the inverter output and the positive voltage rail is connected to the negative voltage rail. A current flowing through the inverter-based resistor varies in direction and magnitude in response to a digital input provided to the positive voltage rail and the negative voltage rail.

Figure 5B:
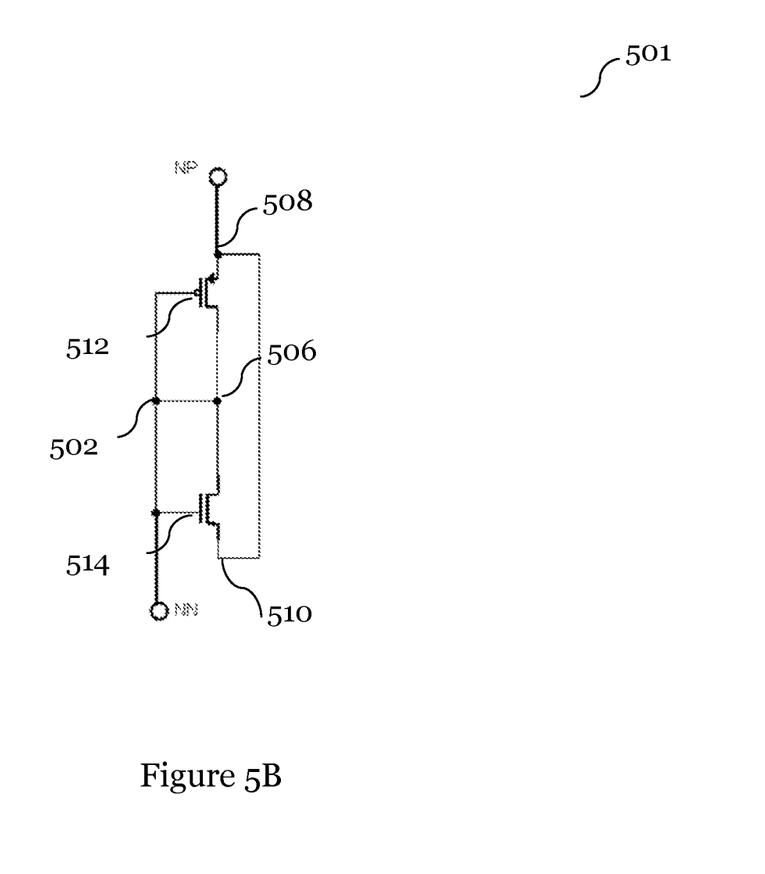

According to various embodiments, each of the at least one digital inverter 302 may include at least one pair of transistors (for example transistors 512 and 514 as shown in FIG. 5B).

According to various embodiments, each of the at least one pair of transistors may include a pair of field effect transistors (FETs).

According to various embodiments, the pair of field effect transistors may include a pair of metal-oxide semiconductor field effect transistors (MOSFETs).

According to various embodiments, the pair of MOSFETs may include a first MOSFET and a second MOSFET, wherein a source of the first MOSFET is connected to a source of the second MOSFET, and wherein a gate of the first MOSFET, a gate of the second MOSFET, a drain of the first MOSFET and a drain of the second MOSFET are all connected.

Figure 3B:
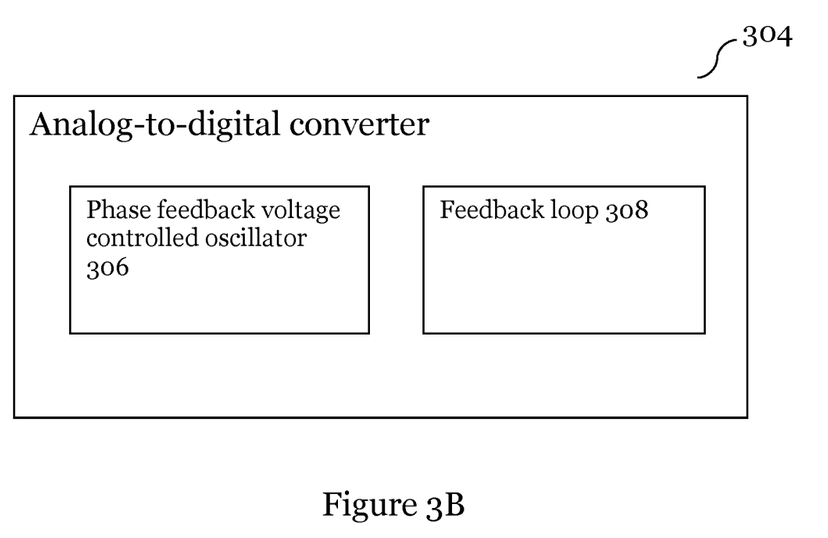
FIG. 3B shows an analog-to-digital converter according to various embodiments.
Figure 4:
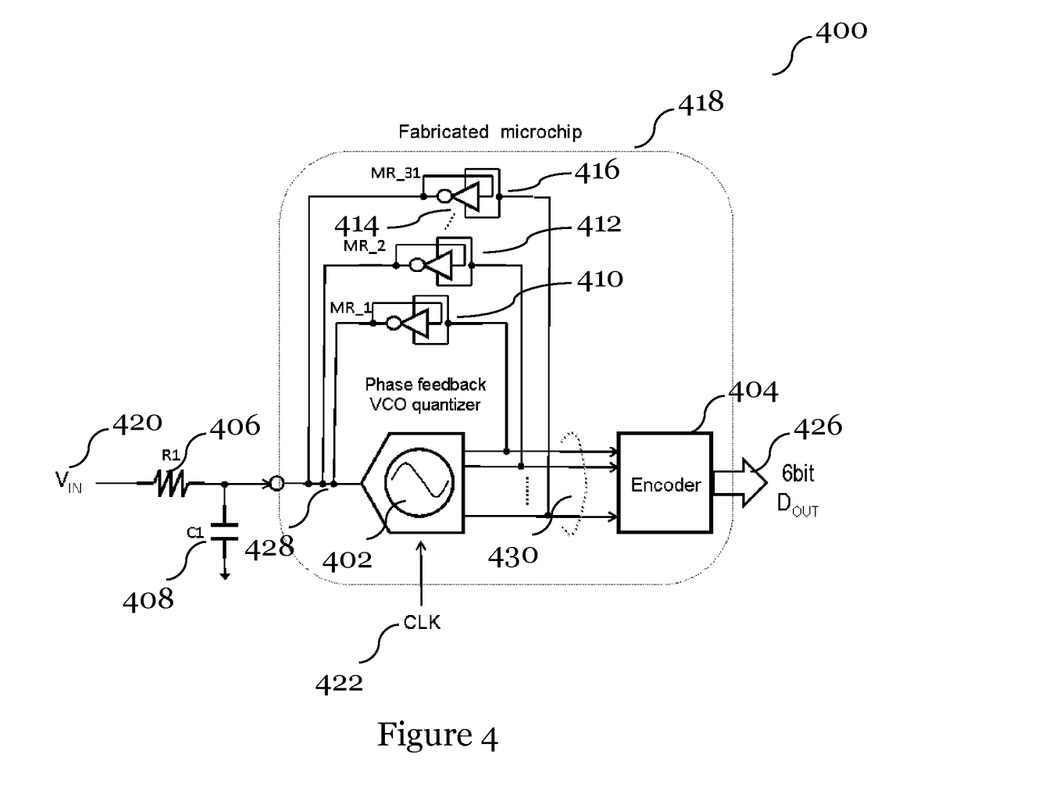
FIG. 4 shows a digital-only analog to digital converter implementable in digital process according to various embodiments.

FIG. 3B shows an analog-to-digital converter 304 (ADC; for example an analog-to-digital converter 400 as shown in FIG. 4) according to various embodiments. The ADC 304 may include: a phase feedback voltage controlled oscillator (VCO) quantizer 306 (for example VCO quantizer 402 as shown in FIG. 4) having a VCO input (for example input 428 as shown in FIG. 4) and a quantizer output for example output 430 as shown in FIG. 4); and a feedback loop 308 coupling the VCO input of the phase feedback VCO quantizer to the quantizer output of the phase feedback VCO quantizer, the feedback loop including one or more inverter-based resistance devices (for example an inverter-based resistor, for example inverter-based resistor 300 as shown in FIG. 3A, for example inverter-based resistors 410, 412, 416 as shown in FIG. 4), wherein each of the one or more digital resistance devices includes at least one digital inverter.

According to various embodiments, each of the at least one digital inverter may be configured to receive an input and provide an output, the digital inverter further including a positive voltage rail and a negative voltage rail, wherein the digital inverter input is connected to the digital inverter output and the positive voltage rail is connected to the negative voltage rail. A current flowing through the inverter-based resistor varies in response to the digital input provided to the positive voltage rail and the negative voltage rail.

According to various embodiments, the each of the at least one digital inverter may include at least one pair of transistors.

According to various embodiments, each of the at least one pair of transistors may include at least one pair of field effect transistors (FETs).

According to various embodiments, each of the at least one pair of field effect transistors may include at least one pair of metal-oxide semiconductor field effect transistors (MOSFETs).

According to various embodiments, a resistance of the each of the at least one digital inverter varies in response to sizes of the MOSFETs.

According to various embodiments, each of the at least one pair of MOSFETs may include a first MOSFET and a second MOSFET, wherein a source of the first MOSFET is connected to a source of the second MOSFET, and wherein a gate of the first MOSFET, a gate of the second MOSFET, a drain of the first MOSFET and a drain of the second MOSFET are all connected.

Figure 3C:
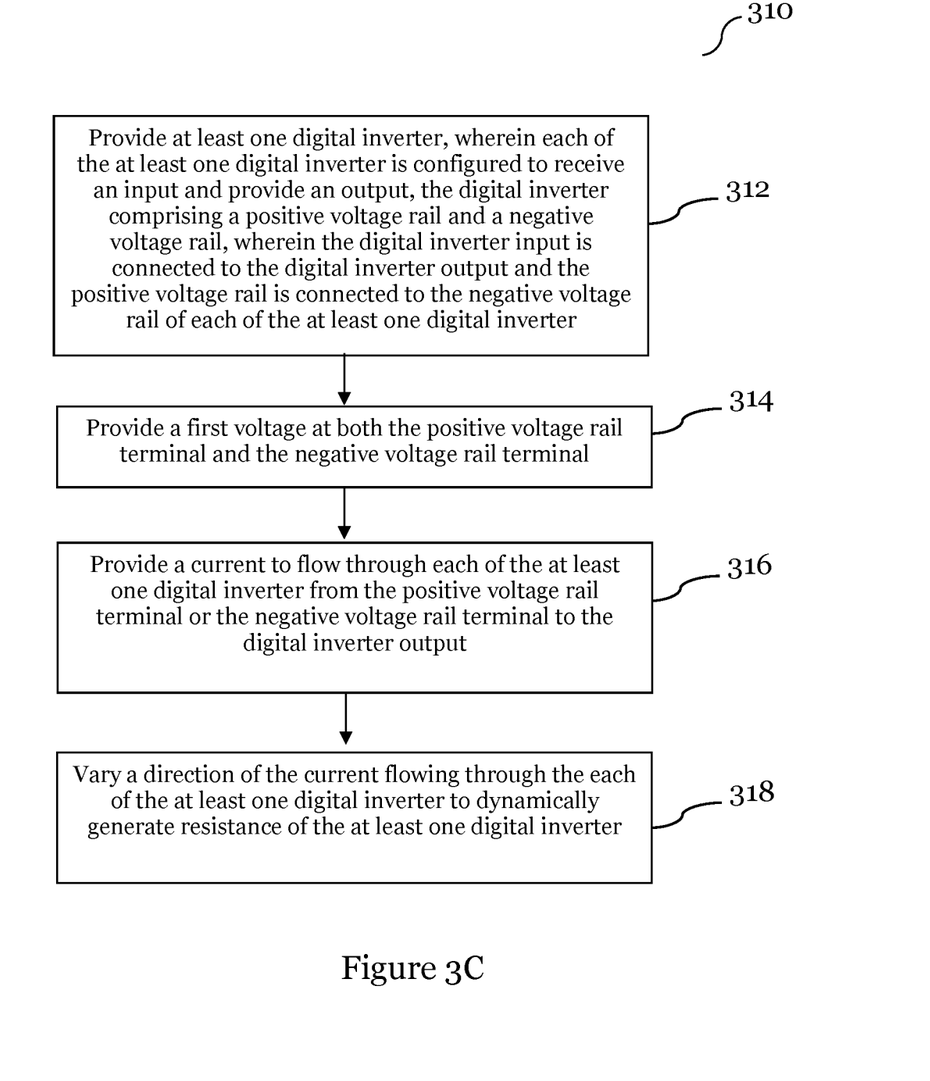
FIG. 3C shows a flow diagram illustrating a method for dynamically generating resistance in a digital-only circuit according to various embodiments.

FIG. 3C shows a flow diagram 310 illustrating a method for dynamically generating resistance in a digital-only circuit according to various embodiments. In 312, at least one digital inverter may be provided, wherein each of the at least one digital inverter is configured to receive an input and provide an output, the digital inverter including a positive voltage rail and a negative voltage rail, wherein the digital inverter input is connected to the digital inverter output and the positive voltage rail is connected to the negative voltage rail of each of the at least one digital inverter. In 314, a first voltage may be provided at both the positive voltage rail terminal and the negative voltage rail terminal. In 316, a (for example bi-directional) current may be provided to flow through each of the at least one digital inverter from positive voltage rail terminal or the negative voltage rail terminal to the digital inverter output. In 318, a direction of the current (or a magnitude of the bi-directional current) flowing through the each of the at least one digital inverter may be varied to dynamically generate resistance of the at least one digital inverter.

According to various embodiments, the step 316 of providing the bi-directional current to flow through the each of the at least one digital inverter from the digital inverter input to a positive voltage rail or a negative voltage rail may include providing a second voltage at the digital inverter input and/or the digital inverter output.

According to various embodiments, the digital-only circuit may be an analog-to-digital converter (ADC) and wherein the step of providing the at least one digital inverter includes providing a feedback loop connecting an input of a phase feedback voltage-controlled oscillator (VCO) quantizer to an output of the phase feedback VCO quantizer, the feedback loop including the at least one digital inverter.

FIG. 4 shows a digital-only ADC 400 according to various embodiments. The digital-only ADC 400 may be implementable in a digital process. Feedback resistors 410, 412, 416, and 418 are now provided. Dots 414 represent further feedback resistors. The feedback resistors 410, 412, 414, 416, and 418 will be described in more detail with reference to FIG. 5A below. By using an inverter cell, the ADC 400 may be implemented in a pure digital process. The fabricated microchip, like indicated by box 418, excludes the front-end RC (in other words resistor R1 (406) and capacitor C1 (408)). An input signal Vin 420 may be provided through the PCB (printed circuit board) RC components, and this does not increase the number of pins, and does not increase the cost. An encoder 404 may receive all outputs 430 of the quantizer 402 (which may receive clock input 422) and may provide an output 426 (for example a 6 bit output).

According to various embodiments, a large number of feedback resistors may be built up from digital invertors. A pure digital process may fabricate the digital-only ADC according to various embodiments. An input signal may just be applied through a RC network to VCO input; therefore, the number of pins does not increase.

FIG. 5A shows an inverter-based resistor 500 (which may for example be used for each of the feedback resistors 410, 412, 414, 416, and 418 of the ADC 400 shown in FIG. 4) according to various embodiments. The functions for each digital output will be described. The inverter-based resistor 500 may include an inverter 504, whose output 506 is connected to the input 502 and two power supplies (Vdd 508 and Vss 5100) are shorted (in other words: connected).

Like shown in the net connections of FIG. 5A and with further reference to FIG. 4, NN is connected to VCO-quantizer input (in other words, the input 428 of the VCO-quantizer 402) and NP may be connected to VCO-quantizer output 430. Due to the phase feedback structure, the VCO input 428 may be a small voltage range around 0.6V. On the other hand, each quantizer output 430 may be a digital-level (i.e. 0/1.2V).

FIG. 5B shows a circuitry 501 implementing the resistor 500 according to various embodiments in an illustration of the circuit with a PMOS (p-channel MOSFET (metal-oxide-semiconductor field-effect transistor)) transistor 512 and an NMOS (n-channel MOSFET) transistor 514. It will be understood that the resistor 500 according to various embodiments may be implemented in various ways, and would not be limited to the implementation shown in FIG. 5B.

Figure 5C:
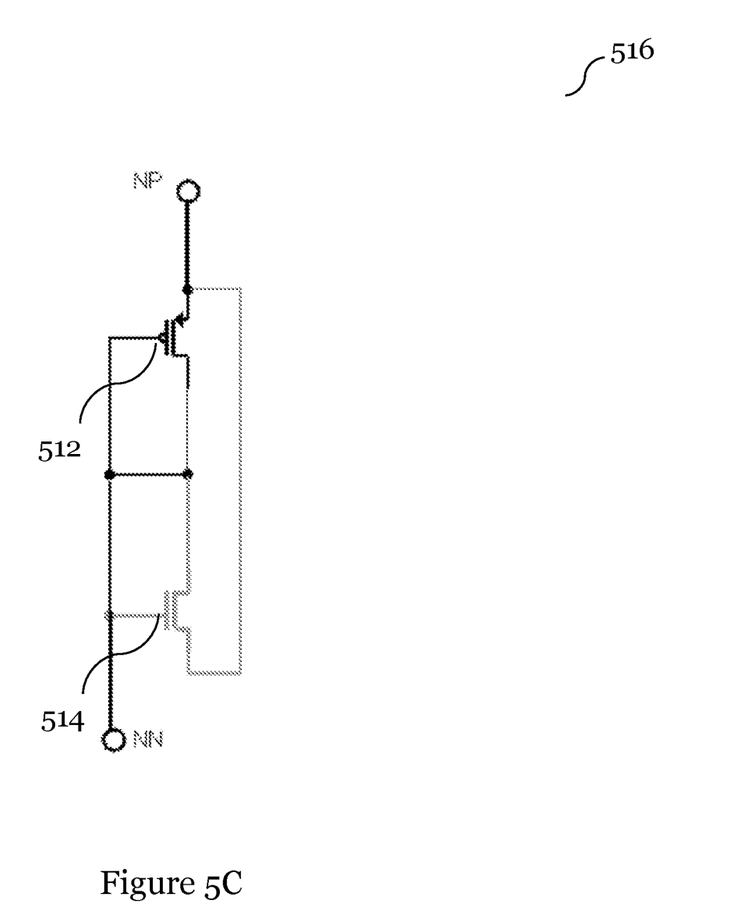

With reference to FIG. 5C, assuming the quantizer output is 1.2V, then the PMOS transistor 512 is active (like illustrated by black lines connected to the PMOS transistor 512 in the illustration 516 of FIG. 5C) and the NMOS transistor 514 is non-active (like illustrated by gray lines connected to the NMOS transistor 514), so the resistor 500 is a diode-connected PMOS. A high resistance may be implemented using a saturation-mode transistor in a small area.

Figure 5D:
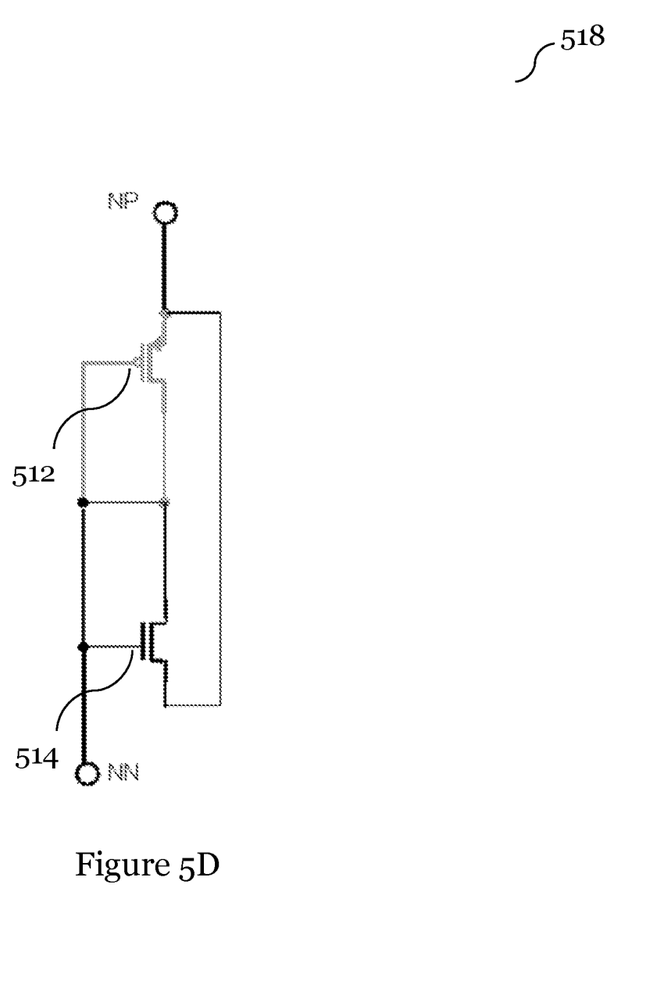

With reference to FIG. 5D, assuming the quantizer output is 0V. Now oppositely to the situation shown in FIG. 5C, the NMOS transistor 514 is active (like illustrated by black lines connected to the NMOS transistor 514 in the illustration 518 of FIG. 5D) and the PMOS transistor 512 is non-active (like illustrated by gray lines connected to the PMOS transistor 512 in the illustration 518 of FIG. 5D), so the resistor is a diode-connected NMOS. Diode-connected MOS (no matter P type, i.e. PMOS, or N type, i.e. NMOS) acts as a resistor when it is active condition.

Figure 6:
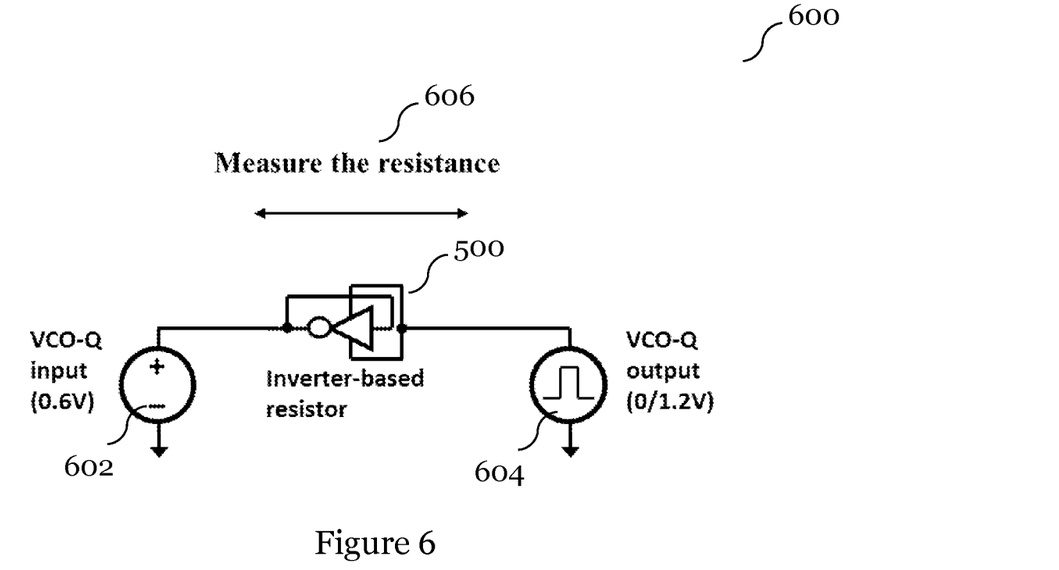
FIG. 6 shows an inverter-based resistor simulation testbench 600 according to various embodiments.

FIG. 6 shows an inverter-based resistor simulation testbench 600 according to various embodiments. The inverter-based resistor 500 may be provided with an VCO-Q input 602. A VCO-Q output of 604 may be provided. Like indicated by arrow 606, the current and the resistance of the inverter-based resistor 500 may be measured. It be assumed that Vco_in=0.6V (i.e. VCO-Q input may be 0.6V), and Vco_out=0/1.2V (i.e. VCO-Q output may be either 0 V or 1.2V). Furthermore, Vdd=1.2V may be assumed.

Figure 7:
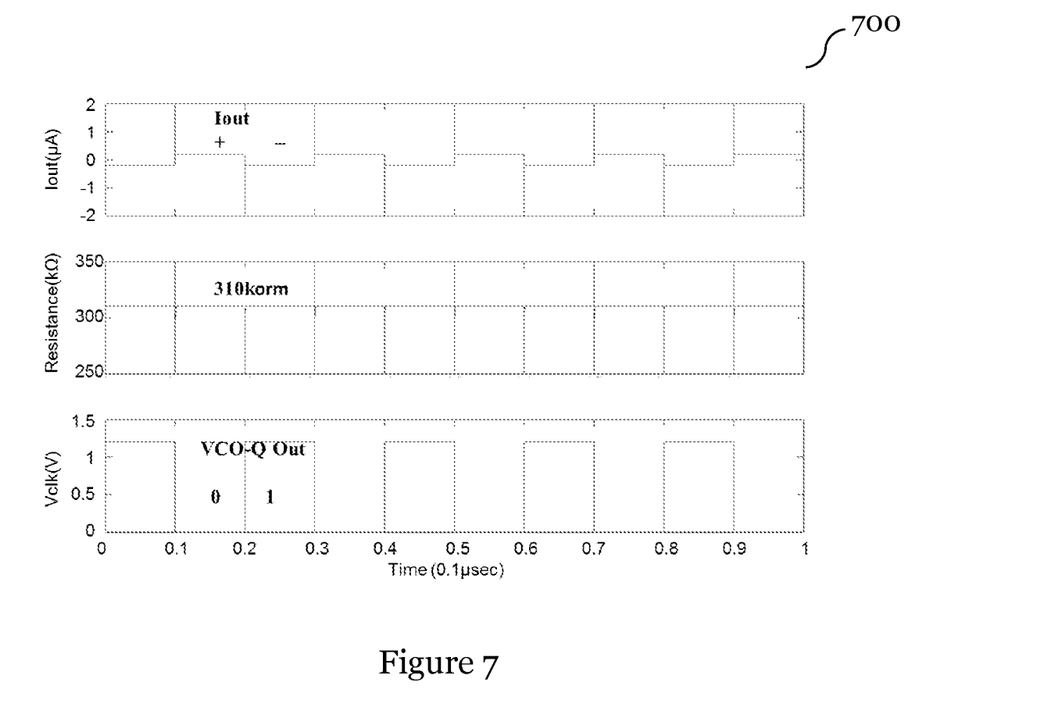
FIG. 7 shows inverter-based resistor simulation result according to various embodiments.

The inverter-based resistor 500 shown in FIGS. 5A and 5B may be simulated in 65 nm CMOS model parameters. By providing 0.6V at NN and inputting 0/1.2V at the NP, the resistance between the two terminals may be measured. No matter which outputs (Logic high or low), the resistance values may be about 310 kΩ, which is expected. The current direction may be opposite between these two conditions, like illustrated in diagrams 700 of FIG. 7. As can be seen, with only polarity changes, resistance is about 310 kΩ in VCO-Q out 1/0. With reference to FIG. 6, 1.2V (logic-high) or 0V (logic-low) is applied at VCO-Q out and flowing current of two terminals measured (as shown in FIG. 7). It can be seen that the current polarity changes based on the VCO-Q applied voltage. However, terminal resistance is about 310 korm for both cases.

Figure 8A:
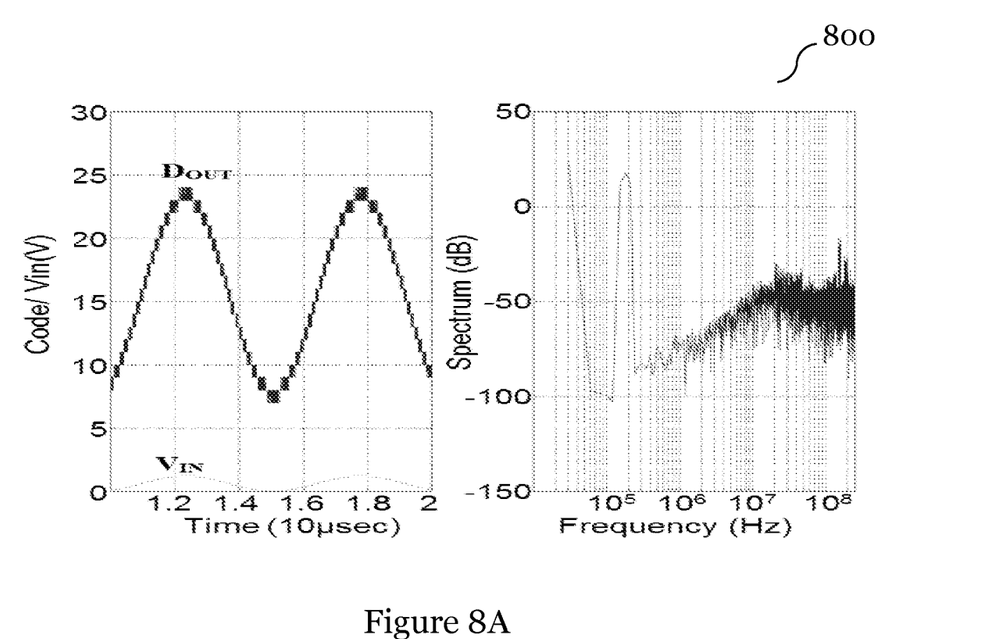
FIG. 8A and FIG. 8B show simulation results comparison according to various embodiments.
Figure 8B:
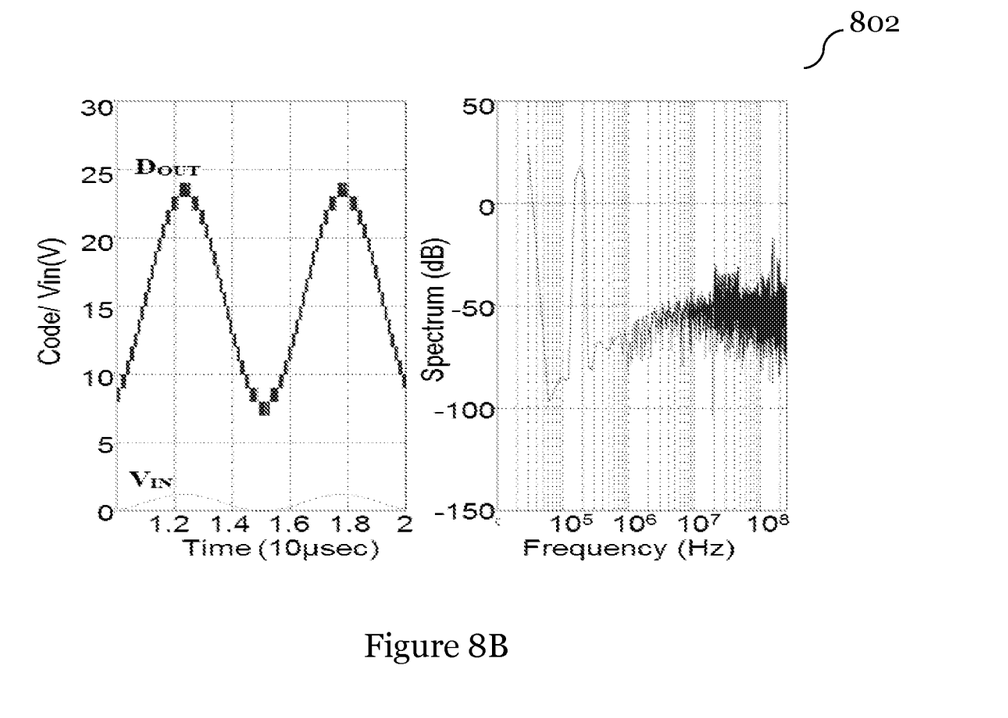
Figure 9A:
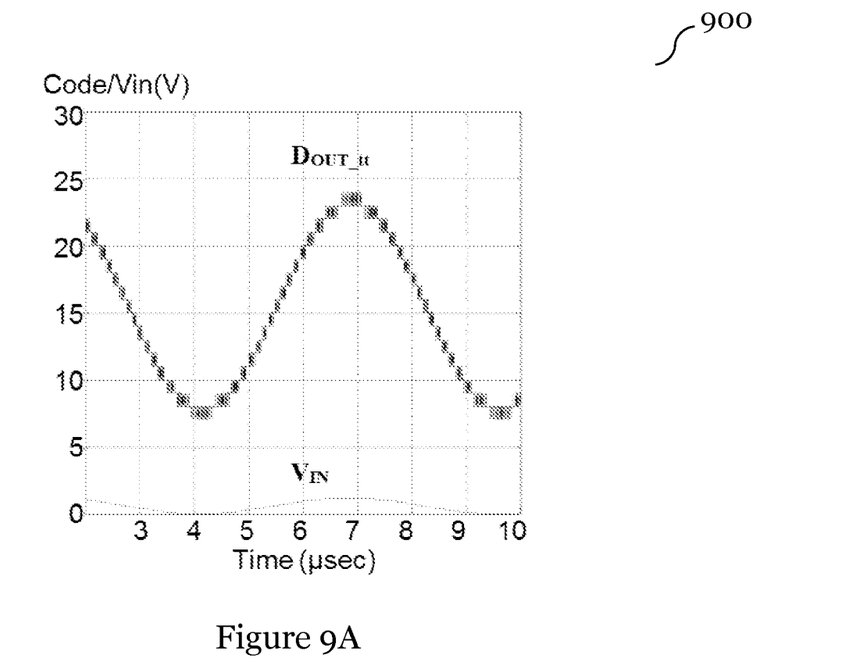
Figure 9B:
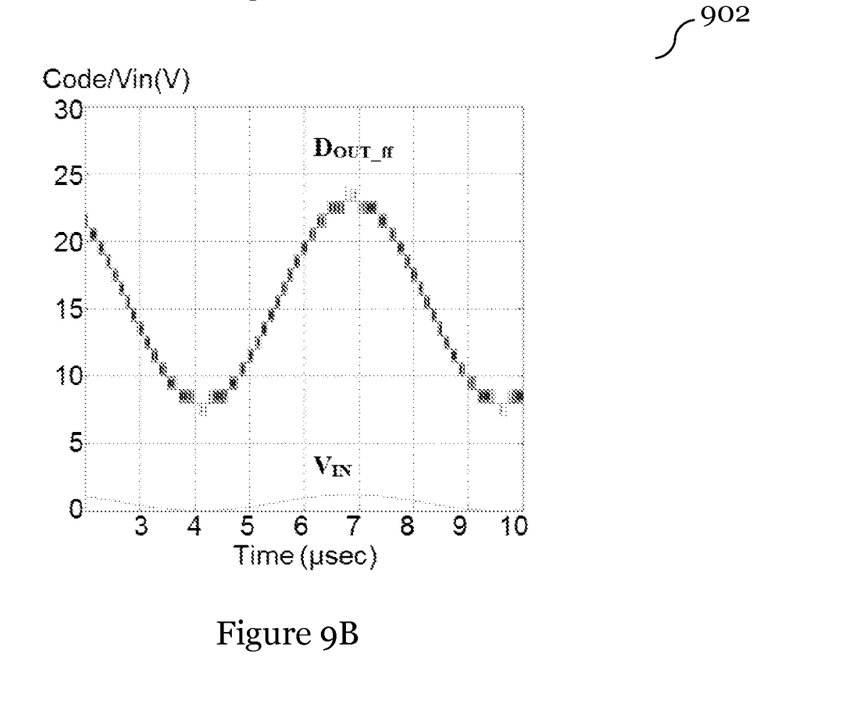
Figure 9C:
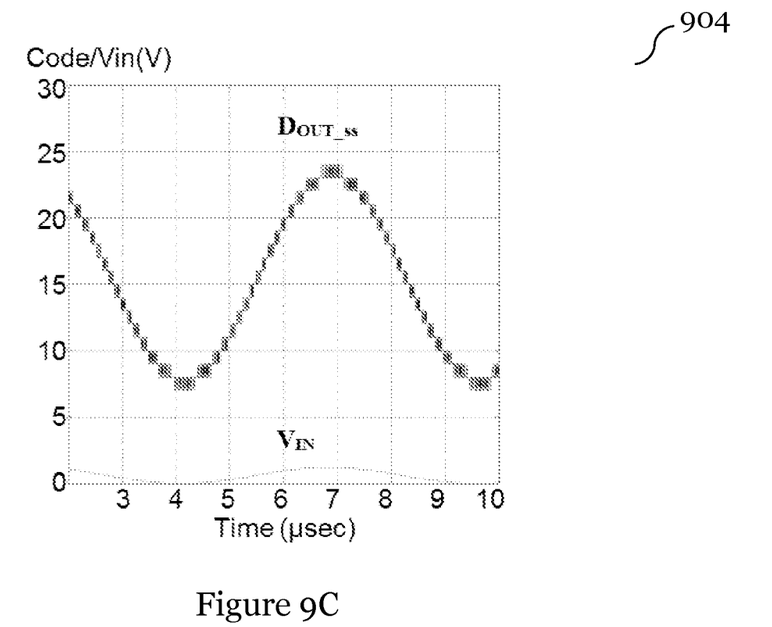
Figure 9D:
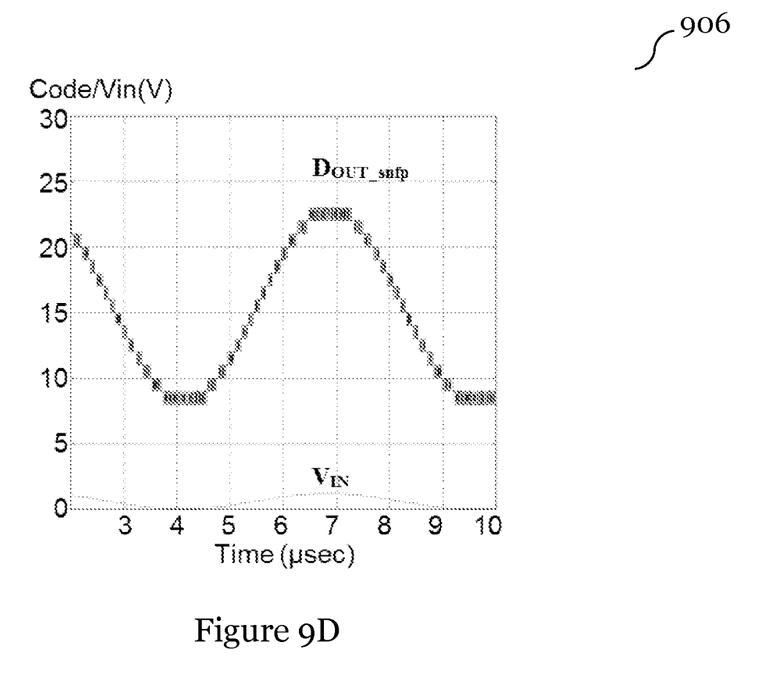
Figure 9E:
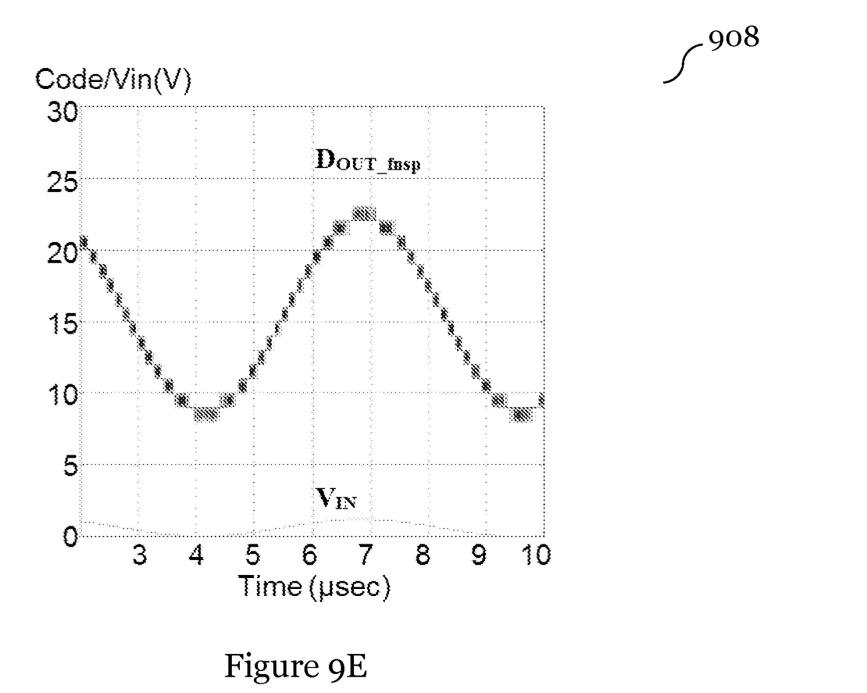

The circuit shown in FIG. 4 may be simulated in 65 nm CMOS model parameters. Vdd=1.2V may be assumed. Firstly a comparison between ADC with resistor feedback and ADC with inverter-based resistor feedback may be conducted in a behavioral-level simulation. In the simulation all blocks except the feedback resistors (which may be inverter-based resistors, and for which transistor models may be used) may be behavioral models (for example according to Verilog-A): a sinusoid signal of 183-kHz may be input (as a $1.2V_{p-p(differential)}$ sine wave input) the ADC and the ADC was synchronized with a sampling clock of 500-MHz. 31 digital output codes of the quantizer may be summed by a behavioral model of the encoder. Simulation results of the resistor feedback and the inverter-based resistor feedback are shown in diagrams 800 (illustrating a resistor feedback) of FIG. 8A and diagrams 802 (illustrating an inverter resistor feedback) of FIG. 8B. Both are very similarly shaped. The low frequency noise of the inverter-based resistor may be higher than that of the resistor feedback. However, because the output codes has a shape of a sine wave, increasing (decreasing) proportionally with the input signal (with quantization noise), and because about 20 dB/Dec of noise shaping (for example in low frequencies, for example with SNDR=64 dB) can be observed, the functionality of proposed ADC is confirmed.

FIG. 9A to 9E shows graphs 900, 902, 904, 906, and 908 of the simulation results with process variation. In this simulation MOS model (typical-typical, fast-fast, slow-slow, snfp (slow NMOS and fast PMOS), fnsp (fast NMOS and slow PMOS)) variation are considered since the dynamic resistor is constituted from the inverter cell. The changed value of feedback resistance due to the process variation is tuned by programming the input resistance (R1). From the simulation results, no matter which models, the ADC outputs follow the input voltage increasing (decreasing) with the sine-wave shape (in other words, the output codes are proportionally increasing (decreasing) with input signal with quantization noise). Therefore, it can be concluded that the proposed ADC functions properly under the process variation.

According to various embodiments, a method to implement an ADC in digital process technology without any passive RC options (in other words: without any passive RC components) may be provided.

According to various embodiments, by employing a proposed structure of ADC, the ADC may be implemented from digital cells and therefore may be fabricated in a cost efficient digital process.

According to various embodiments, an analog passive component, for example a resistor, is built up from the digital standard cell, for example an inverter.

According to various embodiments, an ADC is constituted from digital cells so that it may be implemented in a pure digital process in a cost efficient way.

According to various embodiments, for an ADC function, the voltage on the feedback resistor may be approximately +/−0.6-volts. Therefore, a dynamic resistor is needed. According to various embodiments, a dynamic resistor may be built from an inverter cell in a digital CMOS process.

According to various embodiments, a circuit for a resistor may provide cheaper ADC IP. ADC devices may be used or applied in various consumer products, communication system, and/or similar systems or devices.

Resistors and/or ADC according to various embodiments may be inexpensive, may not need off-chip calibration, and may be fabricated in pure digital process (in other words: may not need resistor options), and may have a high portability to advanced nodes. Since an ADC according to various embodiments includes digital cells, it does not need much design efforts.

With respect to implementability, various embodiments may provide increased performance, less cost, less design effort when ADC IP is designed in a mode advance process (or in a more advanced process), may use a smaller circuit area.

Various embodiments may be attractive for realizing cheaper devices and may need less re-design effort analog-to-digital converter. Various embodiments may easily be ported to advanced nodes without much design effort.

According to various embodiments, a digital-only ADC may be provided which may be implemented in a (for example cost efficient) digital CMOS process. The digital-only ADC may use dynamic resistors constructed from digital inverter cells. Simulation results of the circuit prove the feasibility of the ADC in 65 nm CMOS technology.

While exemplary embodiments have been presented in the foregoing detailed description of the invention, it should be appreciated that a vast number of variations exist.

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

What is claimed is:

1. An inverter-based resistor comprising at least one digital inverter, wherein each of the at least one digital inverter is configured to receive an input and provide an output, each of the at least one digital inverter further comprises a positive voltage rail and a negative voltage rail, wherein the digital inverter input is connected to the inverter output and the positive voltage rail is connected to the negative voltage rail, and wherein a current flowing through the inverter-based resistor varies in direction and magnitude of the current in response to a digital input provided to the positive voltage rail and the negative voltage rail.

2. The inverter-based resistor of claim 1, wherein each of the at least one digital inverter comprises at least one pair of transistors.

3. The inverter-based resistor of claim 2, wherein each of the at least one pair of transistors comprises a pair of field effect transistors (FETs).

4. The inverter-based resistor of claim 3, wherein the pair of field effect transistors comprises a pair of metal-oxide semiconductor field effect transistors (MOSFETs).

5. An inverter-based resistor comprising at least one digital inverter, wherein each of the at least one digital inverter is configured to receive an input and provide an output, each of the at least one digital inverter further comprises a positive voltage rail and a negative voltage rail, wherein the digital inverter input is connected to the inverter output and the positive voltage rail is connected to the negative voltage rail, and wherein a current flowing through the inverter-based resistor varies in direction and magnitude of the current in response to a digital input provided to the positive voltage rail and the negative voltage rail, wherein the pair of MOSFETs comprises a first MOSFET and a second MOSFET, wherein a source of the first MOSFET is connected to a source of the second MOSFET, and wherein a gate of the first MOSFET, a gate of the second MOSFET, a drain of the first MOSFET and a drain of the second MOSFET are all connected.

6. An analog-to-digital converter (ADC) comprising:
a phase feedback voltage controlled oscillator (VCO) quantizer having a VCO input and a quantizer output; and
a feedback loop coupling the VCO input of the phase feedback VCO quantizer to the quantizer output of the phase feedback VCO quantizer, the feedback loop comprising one or more inverter-based resistance devices, wherein each of the one or more digital resistance devices comprises at least one digital inverter.

7. The ADC of claim 6, wherein each of the at least one digital inverter is configured to receive an input and provide an output, the digital inverter further comprising a positive digital inverter output and the positive voltage rail is connected to the negative voltage rail.

8. The ADC of claim 7, wherein the each of the at least one digital inverter comprises at least one pair of transistors.

9. The ADC of claim 8, wherein the each of the at least one pair of transistors comprises at least one pair of field effect transistors (FETs).

10. The ADC of claim 9, wherein each of the at least one pair of field effect transistors comprises at least one pair of metal-oxide semiconductor field effect transistors (MOSFETs).

11. The ADC of claim 10, wherein a resistance of the each of the at least one digital inverter varies in response to sizes of the MOSFETs.

12. The ADC of claim 11, wherein each of the at least one pair of MOSFETs comprises a first MOSFET and a second MOSFET, wherein a source of the first MOSFET is connected to a source of the second MOSFET, and wherein a gate of the first MOSFET, a gate of the second MOSFET, a drain of the first MOSFET and a drain of the second MOSFET are all connected.

13. A method for dynamically generating resistance in a digital-only circuit, the method comprising:
providing at least one digital inverter, wherein each of the at least one digital inverter is configured to receive an input and provide an output, the digital inverter comprising a positive voltage rail and a negative voltage rail, wherein the digital inverter input is connected to the digital inverter output and the positive voltage rail is connected to the negative voltage rail of each of the at least one digital inverter;
providing a first voltage at both the positive voltage rail terminal and the negative voltage rail terminal;
providing a current to flow through each of the at least one digital inverter from the positive voltage rail terminal or the negative voltage rail terminal to the digital inverter output; and
inverter to dynamically generate resistance of the at least one digital inverter.

14. The method of claim 13, wherein the step of providing the bi-directional current to flow through the each of the at least one digital inverter from the digital inverter input to a positive voltage rail or a negative voltage rail comprises providing a second voltage at the digital inverter input and/or the digital inverter output.

15. The method of claim 13, wherein the digital-only circuit is an analog-to-digital converter (ADC) and wherein the step of providing the at least one digital inverter comprises providing a feedback loop connecting an input of a phase feedback voltage-controlled oscillator (VCO) quantizer to an output of the phase feedback VCO quantizer, the feedback loop comprising the at least one digital inverter.

* * * * *